(12) United States Patent
Hiyoshi et al.

(10) Patent No.: US 9,680,006 B2
(45) Date of Patent: Jun. 13, 2017

(54) SILICON CARBIDE SEMICONDUCTOR DEVICE AND METHOD OF MANUFACTURING THE SAME

(71) Applicant: Sumitomo Electric Industries, Ltd., Osaka (JP)

(72) Inventors: Toru Hiyoshi, Osaka (JP); Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/907,023

(22) PCT Filed: Jun. 17, 2014

(86) PCT No.: PCT/JP2014/065971
§ 371 (c)(1),
(2) Date: Jan. 22, 2016

(87) PCT Pub. No.: WO2015/012019
PCT Pub. Date: Jan. 29, 2015

(65) Prior Publication Data
US 2016/0163853 A1    Jun. 9, 2016

(30) Foreign Application Priority Data

Jul. 26, 2013   (JP) .................................. 2013-155618

(51) Int. Cl.
*H01L 29/10*    (2006.01)
*H01L 29/16*    (2006.01)
(Continued)

(52) U.S. Cl.
CPC ........ *H01L 29/7813* (2013.01); *H01L 21/046* (2013.01); *H01L 21/049* (2013.01);
(Continued)

(58) Field of Classification Search
CPC .................... H01L 29/1095; H01L 29/1608
See application file for complete search history.

(56) References Cited

U.S. PATENT DOCUMENTS

2008/0197381 A1    8/2008  Kawashima et al.
2009/0114969 A1    5/2009  Suzuki et al.
(Continued)

FOREIGN PATENT DOCUMENTS

JP    7-326755 A        12/1995
JP    2000-188397 A     7/2000
(Continued)

OTHER PUBLICATIONS

Y. Nakano et al., "690V, 1.00 m$\Omega$cm$^2$4H-SiC Double-Trench MOSFETs," Materials Science Forum vols. 717-720, pp. 1069-1072, 2012.
(Continued)

*Primary Examiner* — Thanh V Pham
(74) *Attorney, Agent, or Firm* — Venable LLP; Michael A. Sartori; F. Brock Riggs

(57) ABSTRACT

A silicon carbide semiconductor device includes a silicon carbide layer having a first main surface and a second main surface opposite to the first main surface. In the second main surface of the silicon carbide layer, a trench having a depth in a direction from the second main surface toward the first main surface is provided, and the trench has a sidewall portion where a second layer and a third layer are exposed and a bottom portion, where a first layer is exposed. A position of the bottom portion of the trench in a direction of depth of the trench is located on a side of the second main surface relative to a site located closest to the first main surface in a region where the second layer and the first layer are in contact with each other, or located as deep as the site in the direction of depth.

5 Claims, 12 Drawing Sheets

(51) Int. Cl.
*H01L 29/78* (2006.01)
*H01L 29/423* (2006.01)
*H01L 29/66* (2006.01)
*H01L 29/04* (2006.01)
*H01L 21/04* (2006.01)

(52) U.S. Cl.
CPC ........ *H01L 29/045* (2013.01); *H01L 29/1095* (2013.01); *H01L 29/1608* (2013.01); *H01L 29/4236* (2013.01); *H01L 29/66068* (2013.01); *H01L 29/66734* (2013.01)

(56) References Cited

U.S. PATENT DOCUMENTS

| | | |
|---|---|---|
| 2011/0024831 A1 | 2/2011 | Nakano |
| 2012/0037920 A1 | 2/2012 | Treu et al. |
| 2012/0228640 A1 | 9/2012 | Masuda et al. |
| 2012/0319134 A1 | 12/2012 | Honaga et al. |
| 2012/0326166 A1* | 12/2012 | Masuda et al. ....... H01L 21/049 257/77 |
| 2013/0001680 A1 | 1/2013 | Nakano |
| 2013/0049105 A1 | 2/2013 | Omori |
| 2013/0075759 A1 | 3/2013 | Wada et al. |
| 2014/0120671 A1 | 5/2014 | Omori |
| 2015/0333137 A1 | 11/2015 | Omori |

FOREIGN PATENT DOCUMENTS

| | | |
|---|---|---|
| JP | 2000-269487 A | 9/2000 |
| JP | 2008-060152 A | 3/2008 |
| JP | 2008-227441 A | 9/2008 |
| JP | 2009-117593 A | 5/2009 |
| JP | 2009-260253 A | 11/2009 |
| JP | 2010-225748 A | 10/2010 |
| JP | 2010-239160 A | 10/2010 |
| JP | 2012-044167 A | 3/2012 |
| JP | 2012-169385 A | 9/2012 |
| JP | 2013-004636 A | 1/2013 |
| JP | 2013-008890 A | 1/2013 |
| JP | 2013-084899 A | 5/2013 |
| WO | 2012/017796 A1 | 2/2012 |
| WO | 2013/046924 A1 | 4/2013 |

OTHER PUBLICATIONS

International Search Report in PCT International Application No. PCT/JP2014/065971, dated Sep. 2, 2014.
Notice of Grounds of Rejection in counterpart Japanese Patent Application No. 2013-155618, dated Nov. 1, 2016.

* cited by examiner

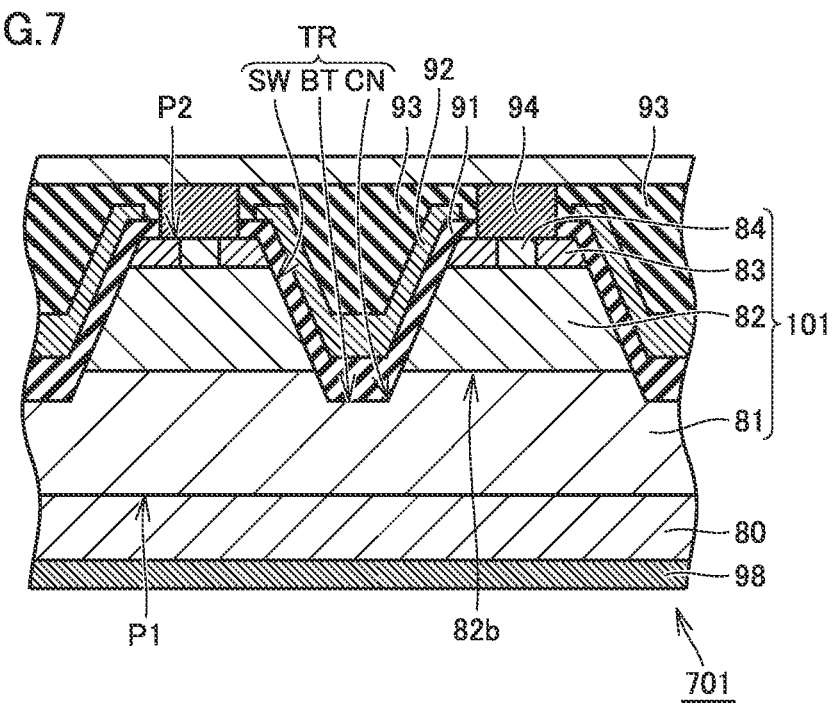

US 9,680,006 B2

SILICON CARBIDE SEMICONDUCTOR DEVICE AND METHOD OF MANUFACTURING THE SAME

TECHNICAL FIELD

The present invention relates to a silicon carbide semiconductor device. More specifically, the present invention relates to a trench gate type silicon carbide semiconductor device.

BACKGROUND ART

A silicon carbide semiconductor device has many advantages such as low power loss and ability to perform an operation at a high temperature as compared with a silicon semiconductor device which is currently mainstream, and has been expected as a next-generation power semiconductor device. In order to seek for a higher breakdown voltage and a low ON resistance of a silicon carbide semiconductor device, various approaches in an aspect of a structure of the device have currently actively been made (see, for example, NPD 1).

CITATION LIST

Non Patent Document

NPD 1: Y. Nakano et al., "690V, 1.00 mΩcm² 4H—SiC Double-Trench MOSFETs," Materials Science Forum Vols. 717-720, pp 1069-1072 (2012)

SUMMARY OF INVENTION

Technical Problem

A trench gate structure is effective for lowering an ON resistance, and a trench gate type silicon carbide semiconductor device in which such a structure has been adopted is viable as a power semiconductor device achieving both of a high breakdown voltage and a low ON resistance. The trench gate structure, however, faces the challenge of tendency of concentration of electric field in a gate insulating film formed at a bottom portion of a groove called a trench. In addition, silicon carbide is higher in relative permittivity than silicon which has conventionally been used, and intense electric field is applied to a gate oxide film due to a difference in relative permittivity between a material forming the gate oxide film and silicon carbide. Under such circumstances, the trench gate type silicon carbide semiconductor device is likely to suffer breakdown of the gate insulating film at the bottom portion of the trench and it has been extremely difficult to achieve both of a high breakdown voltage and a low ON resistance.

In order to address such problems, for example, Y. Nakano et al., "690V, 1.00 mΩcm² 4H—SiC Double-Trench MOSFETs" (NPD 1) has proposed a double trench structure in which a trench is formed in each of a gate and a source. According to this structure, a p-type semiconductor layer formed on a bottom portion of the trench on a source side relaxes electric field formed in the vicinity of a gate insulating film.

In order to obtain the double trench structure disclosed in NPD 1, two types of trenches should be formed in a narrow region. In order to do so, however, a sophisticated processing technique is required, which imposes great burden on a process. Though dry etching is generally adopted for forming a trench, reliability of the gate insulating film may lower due to damages caused by dry etching.

The present invention was made in view of the problems as described above, and an object thereof is to provide a silicon carbide semiconductor device which can readily be manufactured and achieves both of a high breakdown voltage and a low ON resistance.

Solution to Problem

A silicon carbide semiconductor device includes a silicon carbide layer having a first main surface and a second main surface opposite to the first main surface.

Here, the silicon carbide layer includes a first layer forming the first main surface and having a first conductivity type, a second layer provided in the first layer and having a second conductivity type different from the first conductivity type, and a third layer provided on the second layer as being spaced apart from the first layer, forming the second main surface, and having the first conductivity type.

The second main surface of the silicon carbide layer is provided with a trench having a depth in a direction from the second main surface toward the first main surface, and the trench has a sidewall portion where the second layer and the third layer are exposed and a bottom portion continuing to the sidewall portion, where the first layer is exposed.

The silicon carbide semiconductor device further includes a gate insulating film covering each of the sidewall portion and the bottom portion and a gate electrode provided on the gate insulating film.

In the direction of depth of the trench, a position of the bottom portion of the trench is located on a side of the second main surface relative to a site located closest to the first main surface in a region where the second layer and the first layer are in contact with each other, or located as deep as the site in the direction of depth.

Advantageous Effects of Invention

The silicon carbide semiconductor device in the present embodiment can readily be manufactured and can achieve both of a high breakdown voltage and a low ON resistance.

BRIEF DESCRIPTION OF DRAWINGS

FIG. 7 is a diagram schematically showing a construction of a conventional silicon carbide semiconductor device.

DESCRIPTION OF EMBODIMENTS

Figure 1:
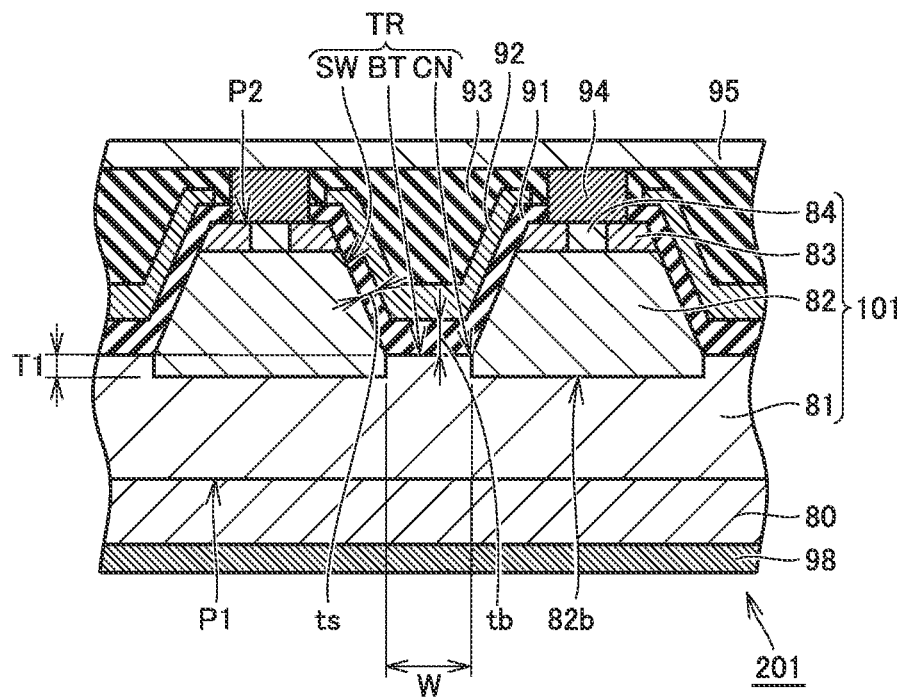
FIG. 1 is a partial cross-sectional view schematically showing a construction of a silicon carbide semiconductor device in one embodiment of the present invention, along the line I-I in FIG. 2.

Overview of an embodiment of the present invention will be described hereinafter in further detail. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ) and { }, respectively. Moreover, a crystallographically negative index is normally expressed by a number with a bar "–" thereabove, however, a negative sign herein precedes a number.

[Description of Embodiment of the Invention of the Subject Application]

An embodiment of the invention of the subject application (hereinafter also denoted as the "present embodiment") will initially be listed and explained in (1) to (11) below.

The present inventors have conducted dedicated studies for solving the problems above, and conceived that electric field applied to a gate insulating film may be relaxed by concentrating electric field in the vicinity of a depletion layer generated by a pn junction in a semiconductor device. As a result of further studies conducted based on the conception, the present inventors have found a novel device structure capable of achieving significantly relaxed electric field applied to the gate insulating film. Namely, the silicon carbide semiconductor device according to the present embodiment has structures below.

(1) A silicon carbide semiconductor device 201 according to the present embodiment includes a silicon carbide layer 101 having a first main surface P1 and a second main surface P2 opposite to first main surface P1.

Silicon carbide layer 101 includes a first layer 81 forming first main surface P1 and having a first conductivity type, a second layer 82 provided in first layer 81 and having a second conductivity type different from the first conductivity type, and a third layer 83 provided on second layer 82 as being spaced apart from first layer 81, forming second main surface P2, and having the first conductivity type.

Second main surface P2 of silicon carbide layer 101 is provided with a trench TR having a depth in a direction from second main surface P2 toward first main surface P1, and trench TR has a sidewall portion SW where second layer 82 and third layer 83 are exposed and a bottom portion BT continuing to sidewall portion SW, where first layer 81 is exposed.

Silicon carbide semiconductor device 201 further includes a gate insulating film 91 covering each of sidewall portion SW and bottom portion BT and a gate electrode 92 provided on gate insulating film 91.

In the direction of depth of trench TR, a position of bottom portion BT of trench TR is located on a side of second main surface P2 relative to a site 82b located closest to first main surface P1 in a region where second layer 82 and first layer 81 are in contact with each other, or located as deep as site 82b in the direction of depth.

According to this silicon carbide semiconductor device 201, a depletion layer generated by a pn junction between first layer 81 having the first conductivity type and second layer 82 having the second conductivity type protects a portion of gate insulating film 91 covering bottom portion BT of trench TR against intense electric field. Therefore, a high breakdown voltage can be achieved while a low ON resistance of the trench gate type is taken advantage of.

(2) In the present embodiment, preferably, on sidewall portion SW, second layer 82 is provided with a surface including a first surface having a plane orientation {0-33-8}.

Thus, of ON resistance of silicon carbide semiconductor device 201, a resistance of a channel portion which is a portion formed by second layer 82 can be lowered. Therefore, a higher resistance of a drift layer portion which is a portion formed from first layer 81 is allowed. Therefore, an impurity concentration in first layer 81 can be lower. Thus, a breakdown voltage can further be higher.

(3) In the present embodiment, preferably, bottom portion BT of trench TR includes a bottom surface extending in a direction crossing sidewall portion SW, trench TR has a corner portion CN at a boundary portion between the bottom surface and sidewall portion SW, and corner portion CN is located in second layer 82.

Thus, corner portion CN where breakdown is likely among others is covered with second layer 82, so that a breakdown voltage can further be higher.

(4) In the present embodiment, bottom portion BT of trench TR includes a bottom surface extending in a direction crossing sidewall portion SW, trench TR has corner portion CN at a boundary portion between the bottom surface and sidewall portion SW, and corner portion CN can also be located in first layer 81. In this case, preferably, relation of T2<T1 is satisfied, where T1 represents a difference between a depth at which the bottom surface is located and a depth at which site 82b is located and T2 represents a shortest distance between corner portion CN and second layer 82.

Thus, since corner portion CN can be arranged in the depletion layer, electric field in the vicinity of corner portion CN can be relaxed and reliability of the gate insulating film can be improved.

(5) In the present embodiment, preferably, a portion of gate insulating film 91 covering bottom portion BT is greater in thickness than a portion of gate insulating film 91 covering sidewall portion SW.

Thus, by forming a thick gate insulating film covering bottom portion BT where electric field is likely to concentrate, reliability of the gate insulating film can be improved.

(6) An embedded region 70 having the second conductivity type is preferably included in first layer 81. Here, preferably, embedded region 70 is spaced apart from second layer 82 by first layer 81 and distant from each of sidewall portion SW and bottom portion BT of trench TR.

Embedded region 70 can effectively relax electric field in the vicinity of bottom portion BT of trench TR. Thus, a breakdown voltage can further be higher.

(7) Preferably, an n-type is defined as the first conductivity type and a p-type is defined as the second conductivity type. Thus, since a channel region (second layer 82) can be formed of a p-type semiconductor, a threshold voltage can further be higher.

The silicon carbide semiconductor device according to the present embodiment can be manufactured with a manufacturing method as below.

(8) A first manufacturing method includes the steps of preparing a silicon carbide substrate 110 including first layer 81 having a first conductivity type, second layer 82 provided in first layer 81 and having a second conductivity type different from the first conductivity type, and third layer 83 provided on second layer 82 as being spaced apart from first layer 81 and having the first conductivity type, forming trench TR having sidewall portion SW reaching second layer 82 through third layer 83 and bottom portion BT including an exposed surface of second layer 82 by removing a part of third layer 83 and second layer 82, and forming an implanted region 81a extending from bottom portion BT of trench TR to first layer 81 and having the first conductivity type by implanting an impurity of the first conductivity type into the exposed surface of second layer 82. Implanted region 81a formed here is integrated with first layer 81.

The first manufacturing method further includes the steps of forming gate insulating film 91 covering sidewall portion SW and bottom portion BT of trench TR and forming gate electrode 92 on trench TR with gate insulating film 91 being interposed. Silicon carbide semiconductor device 201 in the present embodiment can thus readily be manufactured.

(9) A second manufacturing method includes the steps of preparing a silicon carbide substrate 111 including first layer 81 having a first conductivity type, two second layers 82 provided at a distance from each other in first layer 81 and having a second conductivity type different from the first conductivity type, and third layer 83 provided on first layer 81 and second layer 82 and having the first conductivity type, exposing first layer 81 by providing an opening in third layer 83 from above a region between two second layers 82 and forming trench TR having sidewall portion SW reaching second layer 82 through third layer 83 and bottom portion BT including an exposed surface of first layer 81, forming gate insulating film 91 covering sidewall portion SW and bottom portion BT of trench TR, and forming gate electrode 92 on trench TR with gate insulating film 91 being interposed. According to this manufacturing method as well, silicon carbide semiconductor device 201 in the present embodiment can readily be manufactured.

(10) In the first manufacturing method or the second manufacturing method, the step of preparing silicon carbide substrate 110 or 111 can include the step of forming second layer 82 and third layer 83 in first layer 81 through ion implantation. Thus, silicon carbide substrate 110 or 111 can readily be prepared.

(11) In the first manufacturing method or the second manufacturing method, the step of preparing silicon carbide substrate 110 or 111 can also include the step of forming second layer 82 and third layer 83 on first layer 81 through epitaxial growth. By including such a step as well, silicon carbide substrate 110 or 111 can readily be prepared.

[Details of Embodiment of the Invention of the Subject Application]

Though a silicon carbide semiconductor device according to the present embodiment will be described below in further detail, the present embodiment is not limited thereto.

<Silicon Carbide Semiconductor Device>

Silicon carbide semiconductor device 201 according to the embodiment shown in FIG. 1 is constructed as a vertical metal oxide semiconductor field effect transistor (MOSFET). Silicon carbide semiconductor device 201 has a single crystal substrate 80, silicon carbide layer 101 (an epitaxial layer), gate insulating film 91, gate electrode 92, an interlayer insulating film 93, a source electrode 94, a source interconnection layer 95, and a drain electrode 98. Single crystal substrate 80 is composed of silicon carbide and has an n-type (a first conductivity type). Silicon carbide layer 101 is provided on single crystal substrate 80.

Silicon carbide layer 101 is a silicon carbide layer epitaxially grown on single crystal substrate 80. Silicon carbide layer 101 has hexagonal crystal structure having a polytype of 4H. By adopting such crystal structure, silicon carbide semiconductor device 201 can have a low ON resistance. Silicon carbide layer 101 has a lower surface P1 (a first main surface) facing single crystal substrate 80 and an upper surface P2 (a second main surface) opposite to lower surface P1. Silicon carbide layer 101 has an n drift layer 81 (a first layer), a p body layer 82 (a second layer), an n+ layer 83 (a third layer), and a p contact region 84.

N drift layer 81 has the n-type. N drift layer 81 forms lower surface P1 of silicon carbide layer 101. An impurity concentration in n drift layer 81 is preferably lower than an impurity concentration in single crystal substrate 80. An impurity concentration in n drift layer 81 is preferably not lower than $1 \times 10^{15}$ cm$^{-3}$ and not higher than $5 \times 10^{16}$ cm$^{-3}$.

P body layer 82 has a p-type (a second conductivity type different from the first conductivity type). P body layer 82 is provided on n drift layer 81. An impurity concentration in p body layer 82 is preferably not lower than $5 \times 10^{15}$ cm$^{-3}$ and not higher than $2\times10^{18}$ cm$^3$ and it is set, for example, approximately to $1\times10^{18}$ cm$^3$.

N+ layer 83 has the n-type. N+ layer 83 is provided on p body layer 82 to be spaced apart from n drift layer 81 by p body layer 82. N+ layer 83 forms upper surface P2 of silicon carbide layer 101, together with p contact region 84. Namely, n+ layer 83 forms a part of upper surface P2 of silicon carbide layer 101.

Trench TR having a depth in a direction from upper surface P2 toward lower surface P1 is provided in upper surface P2 of silicon carbide layer 101. Trench TR has sidewall portion SW and bottom portion BT. Sidewall portion SW reaches n drift layer 81 through n+ layer 83 and p body layer 82 and p body layer 82 and n+ layer 83 are exposed at sidewall portion SW. Sidewall portion SW includes a channel surface of silicon carbide semiconductor device 201 on p body layer 82. Bottom portion BT is formed to continue to sidewall portion SW and n drift layer 81 is exposed at bottom portion BT. Trench TR has corner portion CN at the boundary between bottom portion BT and sidewall portion SW. Here, a depth of trench TR is, for example, not smaller than 0.3 μm and not greater than 2.0 μm and preferably not smaller than 0.5 μm and not greater than 1.5 μm. In the present embodiment, bottom portion BT and upper surface P2 are substantially in parallel to each other and have a flat shape.

Figure 2:
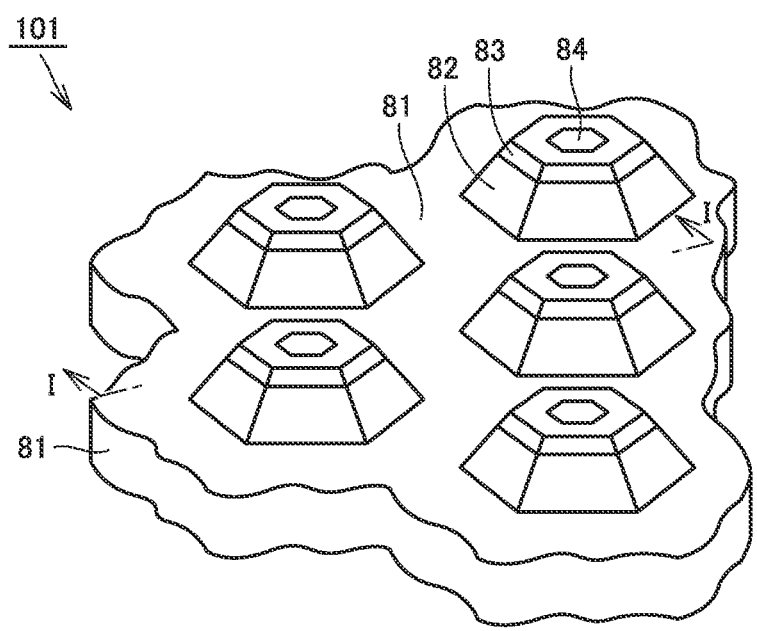
FIG. 2 is a partial perspective view schematically showing a shape of a silicon carbide layer in the silicon carbide semiconductor device in FIG. 1.

FIG. 2 is a partial perspective view schematically showing a shape of silicon carbide layer 101 in silicon carbide semiconductor device 201 in FIG. 1. As shown in FIG. 2, in the present embodiment, trench TR extends to form a mesh having a honeycomb structure and n drift layer 81 is exposed at bottom portion BT of trench TR. Sidewall portion SW is formed to provide an inclined surface of a frustum of a hexagonal pyramid and p body layer 82 and n+ layer 83 are exposed at sidewall portion SW. Upper surface P2 forms a top surface of the frustum of the hexagonal pyramid and has a hexagonal shape in a plan view.

Gate insulating film 91 is provided on trench TR and covers each of sidewall portion SW and bottom portion BT of trench TR. Gate insulating film 91 is suitably a silicon oxide film. Gate electrode 92 is provided on gate insulating film 91. Interlayer insulating film 93 is provided on gate electrode 92 and isolates gate electrode 92 and source electrode 94 from each other. Source electrode 94 is provided on upper surface P2 of silicon carbide layer 101 and in contact with each of n+ layer 83 and p contact region 84. Source interconnection layer 95 is in contact with interlayer insulating film 93 and source electrode 94. Source interconnection layer 95 is, for example, an aluminum layer. Drain electrode 98 is provided on lower surface P1 of silicon carbide layer 101 with single crystal substrate 80 being interposed.

Figure 3:
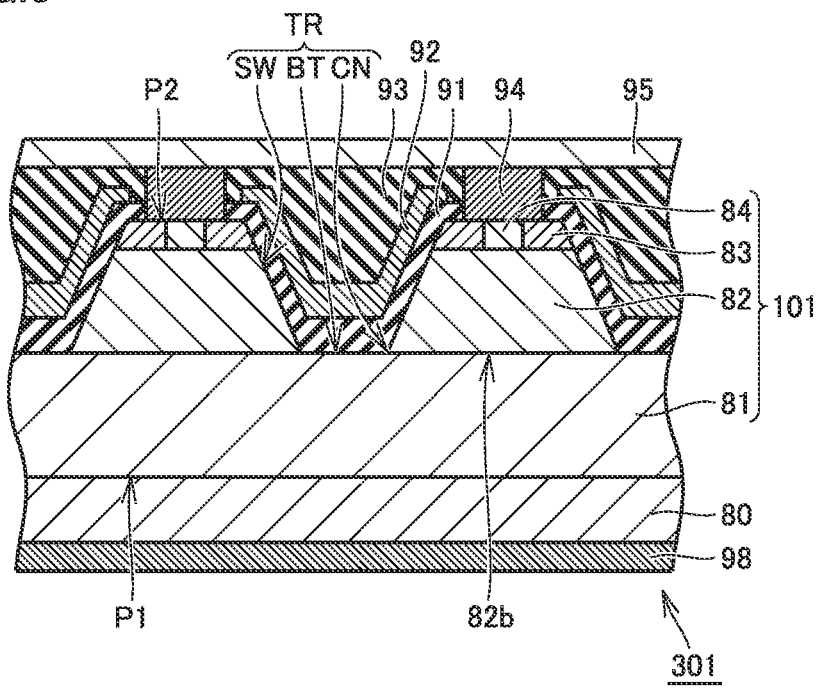
FIG. 3 is a diagram schematically showing a construction of a silicon carbide semiconductor device in one embodiment of the present invention.

Bottom portion BT of trench TR is located on n drift layer 81. Bottom portion BT is located on a side of upper surface P2 relative to site 82b closest to lower surface P1 in the region where p body layer 82 and n drift layer 81 are in contact with each other. Thus, since the depletion layer generated by a pn junction between p body layer 82 and n drift layer 81 covers the region where electric field has conventionally concentrated, electric field applied to a portion of gate insulating film 91 covering bottom portion BT of trench TR is significantly relaxed. Namely, gate insulating film 91 covering bottom portion BT of trench TR is protected by the depletion layer. Bottom portion BT may be located as deep as site 82b in the direction of depth of trench TR as in a silicon carbide semiconductor device 301 shown in FIG. 3. In this case as well, electric field applied to a portion of gate insulating film 91 covering bottom portion BT is relaxed. A construction in which electric field is more significantly relaxed is the construction shown in FIG. 1.

FIG. 7 shows one example of a conventional trench gate type silicon carbide semiconductor device. As shown in FIG. 7, in a silicon carbide semiconductor device 701, in order to completely eliminate a junction field effect transistor (JFET) resistance, bottom portion BT of trench TR is located in n drift layer 81. The reason why such a structure is adopted is that, under a conventional technical concept, priority has been placed on achieving a low ON resistance by eliminating a JFET resistance. In contrast, since gate insulating film 91 is exposed to intense electric field in this structure, a thickness of or an impurity concentration in n drift layer 81 is restricted to some extent in order to maintain a breakdown voltage, and it has been difficult to highly achieve both of a high breakdown voltage and a low ON resistance.

Though the silicon carbide semiconductor device in the present embodiment shown in FIG. 1 may include a JFET resistance component in part, it achieves an extremely high effect of electric field relaxation. Therefore, a breakdown voltage can be improved as a whole and both of a high breakdown voltage and a low ON resistance can highly be achieved.

Though bottom portion BT forms a bottom surface by including a surface extending in a direction crossing sidewall portion SW in FIG. 1, bottom portion BT may be a line defined as one sidewall portion SW and another sidewall portion SW crossing each other. Namely, a cross-section of trench TR may be in a V shape and the effect of the present embodiment is exhibited also with the V shape.

A portion of gate insulating film 91 covering bottom portion BT (tb in FIG. 1) is preferably greater in thickness than a portion of gate insulating film 91 covering sidewall portion SW (ts in FIG. 1). Namely, relation of ts<tb is preferably satisfied in FIG. 1. By forming a thick gate insulating film covering bottom portion BT to which electric field more intense than that to sidewall portion SW is applied, reliability of the gate insulating film can be improved. More preferably, tb and ts satisfy relation of 1.2 ts≤tb.

As shown in FIG. 1, the silicon carbide semiconductor device in the present embodiment satisfies relation of 0≤T1 as described previously, where T1 represents a difference between a depth where the bottom surface (bottom portion BT) of trench TR is located and a depth where site 82b in p body layer 82 located closest to lower surface P1 is located. From a point of view of lowering in JFET resistance as much as possible for seeking for a lower ON resistance, relation of T1≤1 μm is preferably satisfied. From the same point of view, a shortest distance between two p body layers 82 arranged to be opposed to each other with trench TR lying therebetween preferably satisfies relation of 1 μm≤W.

<<Special Surface>>

Preferably, sidewall portion SW of trench TR is inclined with respect to upper surface P2 of silicon carbide layer 101. Namely, trench TR is preferably inversely tapered toward an opening. Specifically, a plane orientation of sidewall portion SW is inclined preferably by not smaller than 50° and not greater than 65° with respect to a {0001} plane and preferably inclined by not smaller than 50° and not greater than 65° with respect to a (000-1) plane. Preferably, sidewall portion SW has a prescribed crystal plane (also referred to as a special surface) in particular in a portion on p body layer 82.

Figure 11:
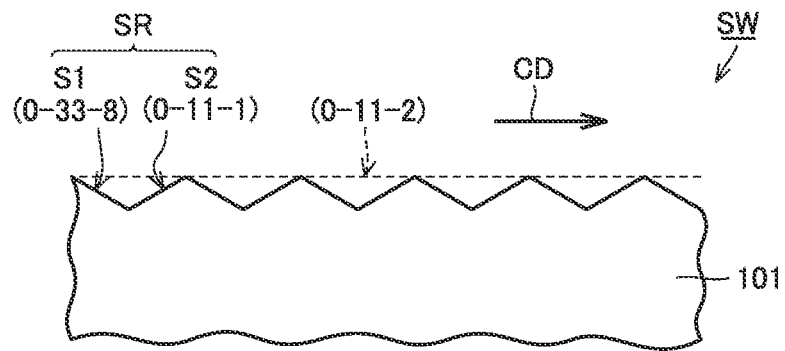
FIG. 11 is a partial cross-sectional view schematically showing a microstructure at a surface of a silicon carbide layer in a silicon carbide semiconductor device.

P body layer 82 exposed at sidewall portion SW (FIG. 1) of trench TR is preferably provided with a special surface as a surface. Sidewall portion SW provided with the special surface includes a surface S1 (a first surface) having a plane orientation {0-33-8} as shown in FIG. 11. In other words, on sidewall portion SW of trench TR, p body layer 82 is provided with a surface including surface S1. Surface S1 preferably has a plane orientation (0-33-8).

More preferably, sidewall portion SW microscopically includes surface S1, and sidewall portion SW microscopically further includes a surface S2 (a second surface) having a plane orientation {0-11-1}. Here, "microscopic" means "in detail to such an extent that a dimension about twice as large as interatomic spacing is at least taken into consideration." As a method of observing such a microscopic structure, for example, TEM (Transmission Electron Microscope) can be employed. Surface S2 preferably has a plane orientation (0-11-1).

Preferably, surface S1 and surface S2 of sidewall portion SW form a combined surface SR having a plane orientation {0-11-2}. Namely, combined surface SR is formed by periodic repetition of surfaces S1 and S2. Such a periodic structure can be observed, for example, with TEM or AFM (Atomic Force Microscopy). In this case, combined surface SR has an off angle of 62° macroscopically with respect to the {000-1} plane. Here, "macroscopic" means ignoring a microstructure having a dimension as small as interatomic spacing. For measuring such a macroscopic off angle, for example, a method with the use of general X-ray diffraction can be employed. Preferably, combined surface SR has a plane orientation (0-11-2). In this case, combined surface SR has an OFF angle of 62° macroscopically with respect to a (000-1) plane.

Preferably, a channel direction CD representing a direction in which carriers flow over a channel surface (that is, a direction of thickness of a MOSFET (a vertical direction in FIG. 1 and the like)) extends along a direction in which periodic repetition described above appears. A detailed structure of combined surface SR will now be described.

Figure 12:
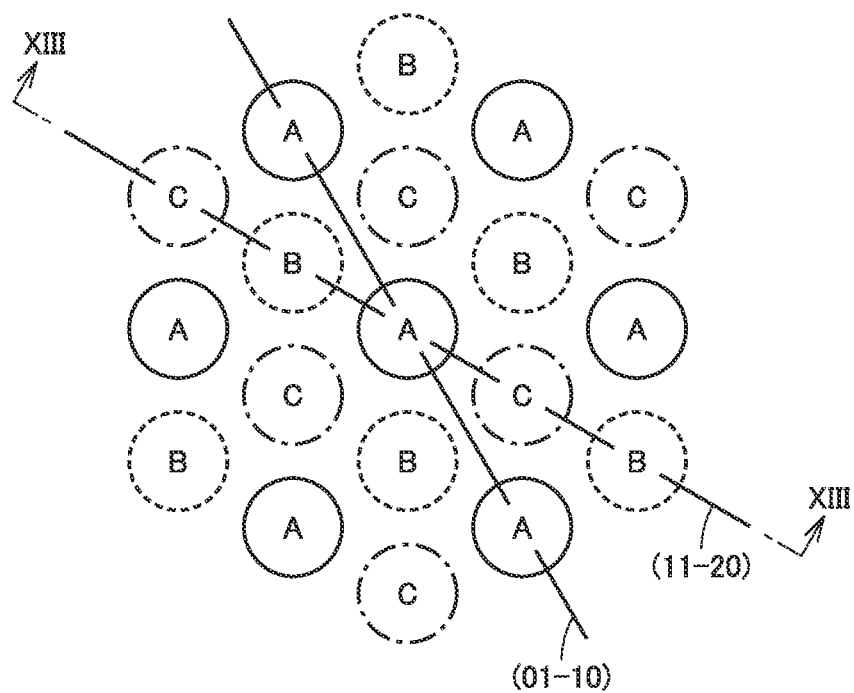
FIG. 12 is a diagram showing crystal structure at a (000-1) plane in a hexagonal crystal having a polytype of 4H.

In general, when silicon carbide single crystal of a polytype of 4H is viewed from the (000-1) plane, as shown in FIG. 12, Si atoms (or C atoms) are provided such that atoms in an A layer (a solid line in the figure), atoms in a B layer located thereunder (a dashed line in the figure), atoms in a C layer located thereunder (a chain dotted line in the figure), and atoms in the B layer located thereunder (not shown) are repeatedly provided. Namely, such a periodic stack structure as ABCBABCBABCB . . . with four layers of ABCB being defined as one period is provided.

Figure 13:
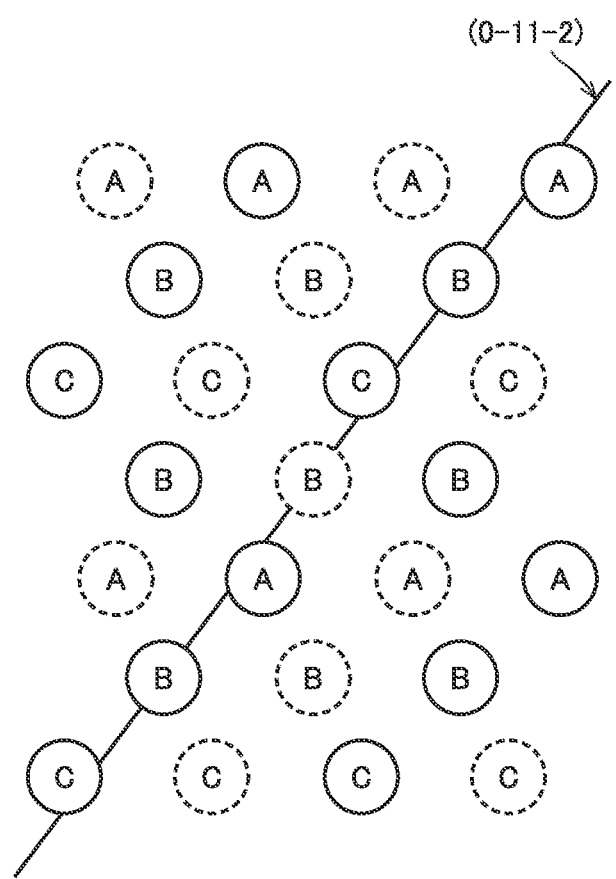
FIG. 13 is a diagram showing crystal structure at a (11-20) plane along the line XIII-XIII in FIG. 12.

As shown in FIG. 13, at a (11-20) plane (a cross-section along the line XIII-XIII in FIG. 12), atoms in each layer of four layers of ABCB forming one period described above are not aligned to completely extend along a (0-11-2) plane. FIG. 13 shows the (0-11-2) plane as it passes through positions of atoms in the B layer, and in this case, it can be seen that atoms in each of the A layer and the C layer are displaced from the (0-11-2) plane. Therefore, even though a macroscopic plane orientation of a surface of silicon carbide single crystal, that is, a plane orientation in a case where an atomic-level structure is ignored, is limited to (0-11-2), this surface can microscopically take various structures.

Figure 14:
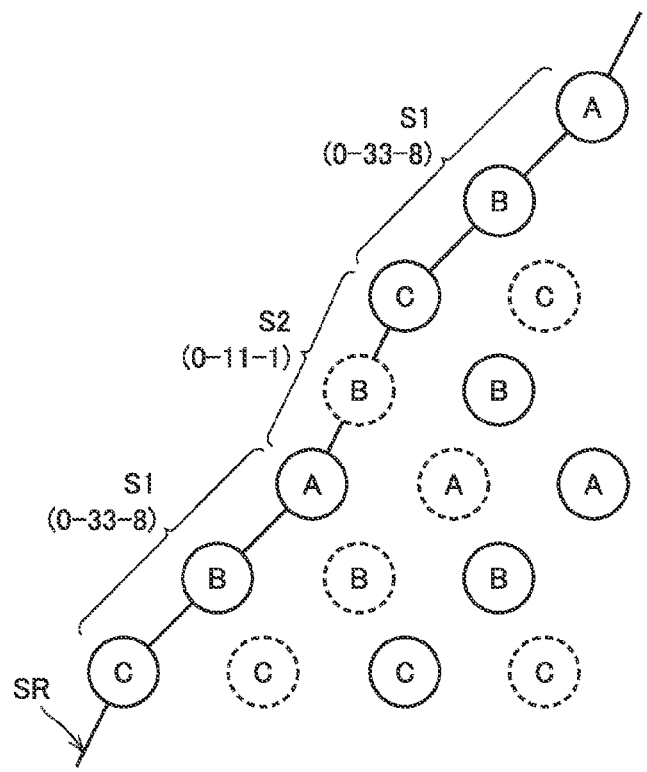
FIG. 14 is a diagram showing in a (11-20) plane, crystal structure in the vicinity of a surface of a combined surface in FIG. 11.

As shown in FIG. 14, combined surface SR is formed in such a manner that surface S1 having the plane orientation (0-33-8) and surface S2 connected to surface S1 and having a plane orientation different from the plane orientation of surface S1 are alternately provided. A length of each of surface S1 and surface S2 is twice as large as interatomic spacing of Si atoms (or C atoms). It is noted that a surface obtained by averaging surface S1 and surface S2 corresponds to the (0-11-2) plane.

Figure 15:
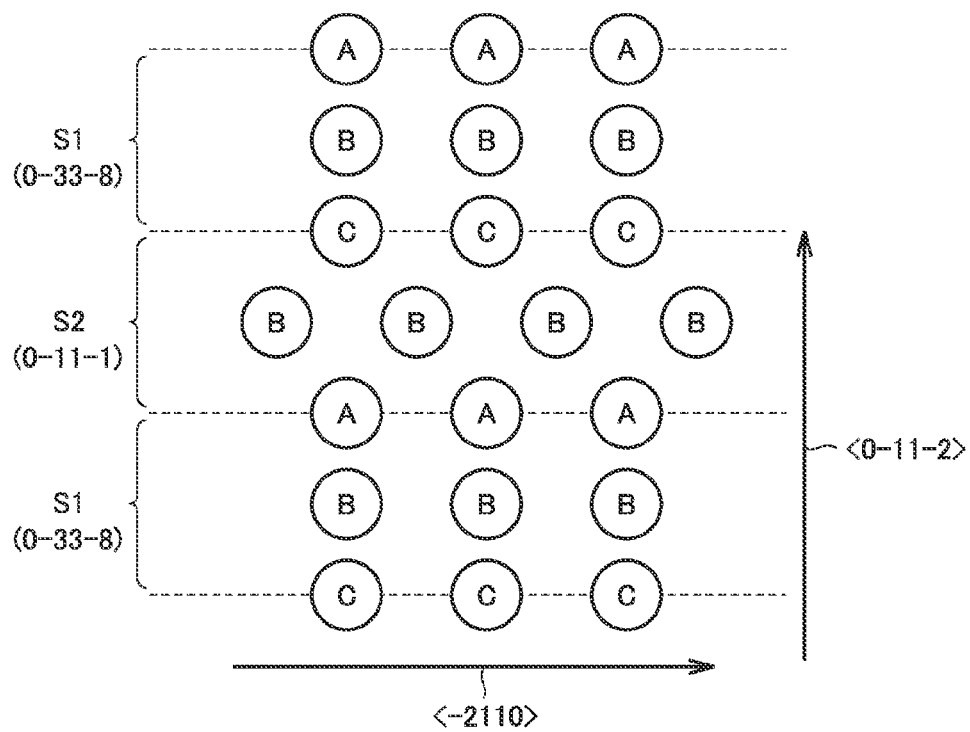
FIG. 15 is a diagram when the combined surface in FIG. 11 is viewed from a (01-10) plane.

As shown in FIG. 15, when combined surface SR is viewed from a (01-10) plane, single crystal structure periodically includes a structure equivalent to cubic crystal in part (a portion of surface S1). Specifically, combined surface SR is formed in such a manner that surface S1 having a plane orientation (001) in structure equivalent to the cubic crystal described above and surface S2 connected to surface S1 and having a plane orientation different from the plane orientation of surface S1 are alternately provided. Thus, it is also possible in a polytype other than 4H to form a surface from a surface having the plane orientation (001) in the structure equivalent to the cubic crystal (surface Si in FIG. 15) and a surface connected to this surface and having a plane orientation different from this plane orientation (surface S2 in FIG. 15). The polytype may be, for example, 6H or 15R.

Figure 16:
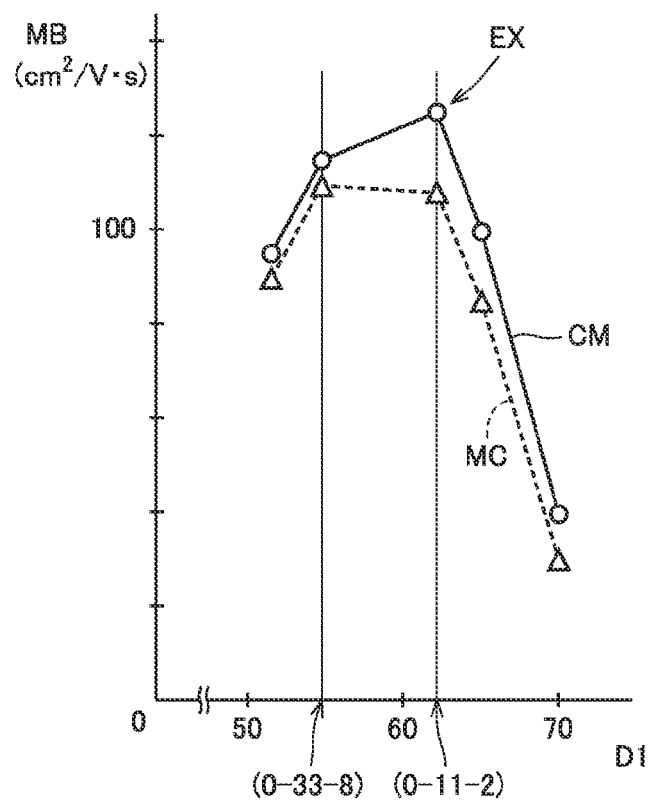
FIG. 16 is a graph showing one example of relation of a macroscopically viewed angle between a channel surface and a (000-1) plane with channel mobility, in each of a case where thermal etching is performed and a case where it is not performed.

Relation between a crystal plane of sidewall portion SW and mobility MB of a channel surface will now be described with reference to FIG. 16. In the graph in FIG. 16, the abscissa represents an angle D1 formed between a macroscopic plane orientation of sidewall portion SW having a channel surface and the (000-1) plane and the ordinate represents mobility MB. A plot group CM corresponds to a case where sidewall portion SW is finished as a special surface through thermal etching and a plot group MC corresponds to a case where such thermal etching is not performed. A manufacturing method such as thermal etching will be described later.

Mobility MB in plot group MC was highest when a macroscopic plane orientation of the surface of the channel surface was set to (0-33-8). This may be because, in a case where thermal etching is not performed, that is, a microscopic structure of the channel surface is not particularly controlled, by setting a macroscopic plane orientation to (0-33-8), a ratio of formation of a microscopic plane orientation (0-33-8), that is, a plane orientation (0-33-8) in a case of considering even an atomic level, was probabilistically high.

On the other hand, mobility MB in plot group CM was highest when a macroscopic plane orientation of the surface of the channel surface was set to (0-11-2) (an arrow EX). This may be because, as a large number of surfaces S1 each having the plane orientation (0-33-8) are regularly and densely arranged with surface S2 being interposed as shown in FIGS. 14 and 15, a ratio occupied by the microscopic plane orientation (0-33-8) was high at the surface of the channel surface.

Figure 17:
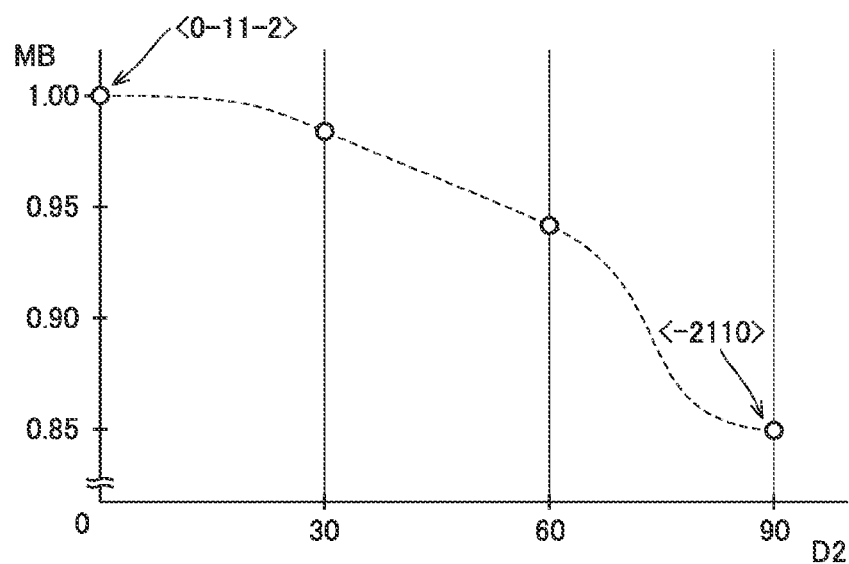
FIG. 17 is a graph showing one example of relation of an angle between a channel direction and a <0-11-2> direction with channel mobility.

It is noted that, on combined surface SR, mobility MB has orientation dependency. In the graph shown in FIG. 17, the abscissa represents an angle D2 between a channel direction and a <0-11-2> direction and the ordinate represents mobility MB (arbitrary unit) of the channel surface. A dashed line is supplementarily provided in order to facilitate viewing of the graph. It was found from this graph that, in order to increase channel mobility MB, angle D2 which channel direction CD (FIG. 11) has is preferably not smaller than 0° and not greater than 60° and more preferably substantially 0°.

Figure 18:
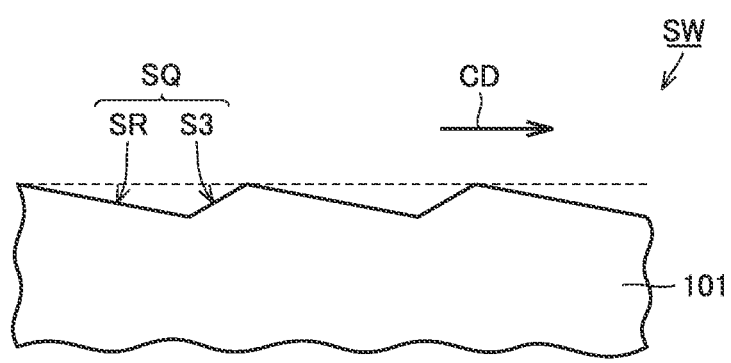
FIG. 18 is a diagram showing a modification of FIG. 11.

As shown in FIG. 18, sidewall portion SW may further include a surface S3 (a third surface) in addition to combined surface SR. More specifically, sidewall portion SW may include a combined surface SQ formed by periodic repetition of surface S3 and combined surface SR. In this case, an off angle of sidewall portion SW with respect to the {000-1} plane is deviated from 62° which is an ideal off angle of combined surface SR. This deviation is preferably small and preferably within a range of ±10°. A surface included in such a range of angles is exemplified by a surface having a macroscopic plane orientation of a {0-33-8} plane. More preferably, an off angle of sidewall portion SW with respect to the (000-1) plane is deviated from 62° which is an ideal off angle of combined surface SR. This deviation is preferably small and preferably within a range of ±10°. A surface included in such a range of angles is exemplified by a surface having a macroscopic plane orientation of a (0-33-8) plane. Such a periodic structure can be observed, for example, with TEM or AFM.

For reasons described above, on sidewall portion SW (FIG. 1) of trench TR, p body layer 82 is preferably provided with a surface including surface S1 (FIG. 11) having a plane orientation {0-33-8}. Thus, of ON resistance of silicon carbide semiconductor device 201, a resistance of a channel portion which is a portion formed from p body layer 82 can be lowered. Therefore, a higher resistance of n drift layer 81 is allowed. Therefore, an impurity concentration in n drift layer 81 can be lower. Thus, a breakdown voltage of the silicon carbide semiconductor device can further be higher.

This surface may microscopically include surface S1 and the surface may microscopically further include surface S2 (FIG. 11) having a plane orientation {0-11-1}. Surfaces S1 and S2 of this surface preferably form combined surface SR (FIG. 11) having a plane orientation {0-11-2}. This surface more preferably macroscopically has an off angle of 62°±10° with respect to a {000-1} plane. Thus, a resistance in the channel portion can further be lowered.

<Method of Manufacturing Silicon Carbide Semiconductor Device>

A method of manufacturing a silicon carbide semiconductor device according to the present embodiment will now be described. The first manufacturing method and the second manufacturing method shown below are suitable as the method of manufacturing a silicon carbide semiconductor device according to the present embodiment.

<<First Manufacturing Method>>

Figure 8A:
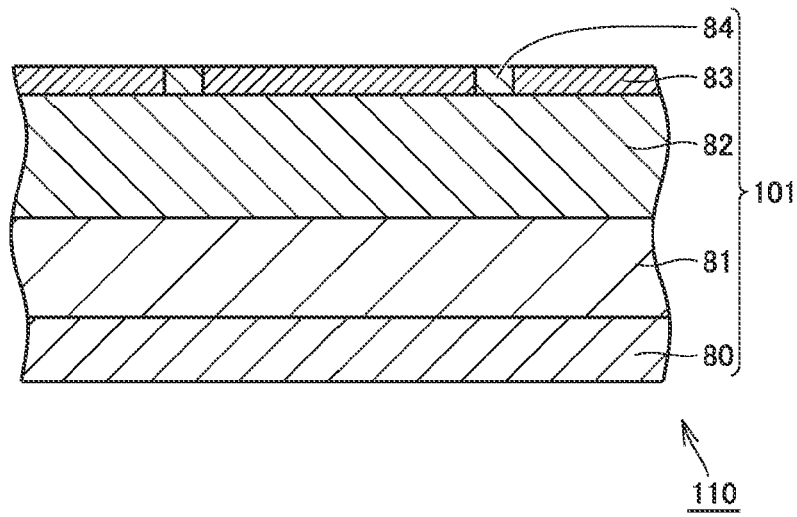
FIG. 8A is a partial cross-sectional view schematically showing a process for manufacturing the silicon carbide semiconductor device in one embodiment of the present invention.

As shown in FIG. 8A, n drift layer 81 is initially formed on single crystal substrate 80. Specifically, n drift layer 81 is formed through epitaxial growth on single crystal substrate 80. This epitaxial growth can be achieved with CVD (Chemical Vapor Deposition) in which, for example, a gas mixture of silane ($SiH_4$) and propane ($C_3H_8$) is used as a source gas, and, for example, a hydrogen gas ($H_2$) is used as a carrier gas. Here, for example, nitrogen (N) or phosphorus (P) is preferably introduced as an impurity.

Then, p body layer 82, n+ layer 83, and p contact region 84 are formed in n drift layer 81. Formation thereof can be achieved, for example, by ion implantation into n drift layer 81. In ion implantation for forming p body layer 82 and p contact region 84, ions of an impurity for providing the p-type such as aluminum (Al) are implanted. Alternatively, in ion implantation for forming n+ layer 83, an impurity for providing the n-type such as phosphorus (P) is implanted. P body layer 82 is formed through ion implantation to a depth preferably not greater than 1 µm, and for example, to a depth approximately from 0.7 to 0.8 µm. N+ layer 83 is formed through ion implantation such that a channel length of silicon carbide semiconductor device 201 is substantially approximately from 0.3 to 0.6 µm.

Epitaxial growth accompanying addition of an impurity may be employed instead of ion implantation.

Then, heat treatment for activating an impurity is performed. A temperature for this heat treatment is preferably not lower than 1500° C. and not higher than 1900° C. and it is set, for example, to approximately 1700° C. A time period for heat treatment is set, for example, to approximately 30 minutes. An atmosphere for heat treatment is preferably an inert gas atmosphere, and for example, an Ar atmosphere is adopted.

As above, silicon carbide substrate 110 including n drift layer 81, p body layer 82 provided in n drift layer 81, and n+ layer 83 provided on p body layer 82 as being spaced apart from n drift layer 81 is prepared.

Figure 8B:
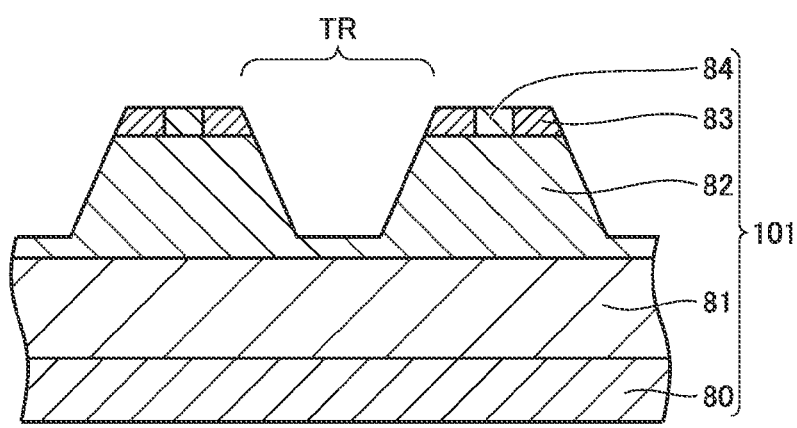
FIG. 8B is a partial cross-sectional view schematically showing the process for manufacturing the silicon carbide semiconductor device in one embodiment of the present invention.

Then, the step of forming trench TR is performed. Trench TR shown in FIG. 8B is formed by forming a groove perpendicular to upper surface P2, which reaches p body layer 82 through n+ layer 83, by initially removing a part of n+ layer 83 and p body layer 82 through etching with a mask layer being interposed, and thereafter further removing a part of n+ layer 83 and p body layer 82 through thermal etching such that the trench is inversely tapered toward the opening.

Here, a silicon oxide film is preferably employed as the mask layer. The silicon oxide film is suitable because it can easily be formed by thermally oxidizing upper surface P2.

As an etching method performed for forming a perpendicular groove, for example, reactive ion etching (RIE) or inductively coupled plasma (ICP) RIE can be employed. Specifically, ICP-RIE using, for example, $SF_6$ or a gas mixture of $SF_6$ and $O_2$ as a reaction gas can be employed.

Thermal etching performed after the perpendicular groove is formed can be performed, for example, through heating in an atmosphere containing a reactive gas having one or more types of halogen atoms. One or more types of halogen atoms include at least any of chlorine (Cl) atoms and fluorine (F) atoms. This atmosphere is, for example, of $Cl_2$, $BCl_3$, $SF_6$, or $CF_4$. Thermal etching is performed in such a manner that, for example, a gas mixture of a chlorine gas and an oxygen gas is used as a reaction gas and a temperature for heat treatment, for example, not lower than 700° C. and not higher than 1000° C. is set.

It is noted that the reaction gas may contain a carrier gas in addition to the chlorine gas and the oxygen gas described above. For example, a nitrogen ($N_2$) gas, an argon gas, a helium gas, or the like can be employed as a carrier gas. Then, in a case where a temperature for heat treatment not lower than 700° C. and not higher than 1000° C. is set as described above, a rate of etching of silicon carbide attains, for example, to approximately 70 µm/hour. In addition, in this case, since the mask layer made of silicon oxide is extremely high in rate of selective etching of silicon carbide, it is not substantially etched during etching of silicon carbide. Thus, self-formation of a special surface on sidewall portion SW, in particular on p body layer 82, takes place. The mask layer used here can be removed with any method such as etching.

As above, as shown in FIG. 8B, trench TR having sidewall portion SW reaching p body layer 82 through n+ layer 83 and bottom portion BT including the exposed surface of p body layer 82 can be formed.

Figure 8C:
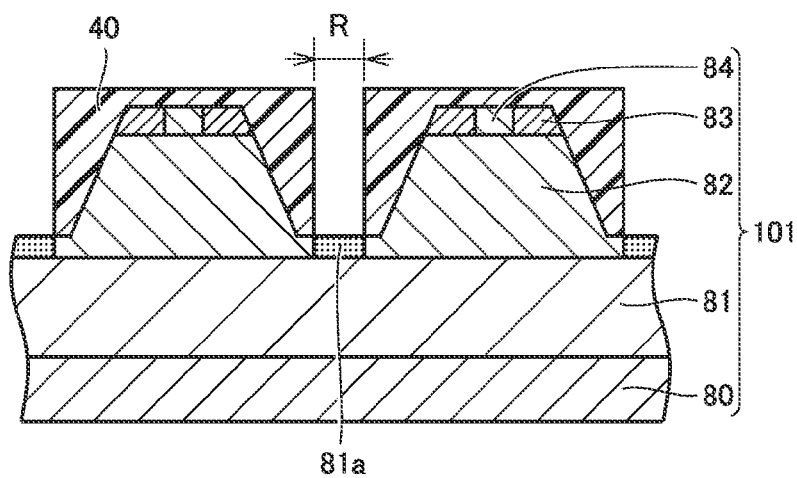
FIG. 8C is a partial cross-sectional view schematically showing the process for manufacturing the silicon carbide semiconductor device in one embodiment of the present invention.

Then, as shown in FIG. 8C, ions are implanted into the exposed surface of p body layer 82 (the remainder of p body layer 82 at bottom portion BT) through an ion implantation mask layer 40, to thereby form implanted region 81a having the n-type. In ion implantation, an impurity for providing the n-type such as phosphorus (P) is implanted. Since formed implanted region 81a has the n-type, it can be equated with n drift layer 81 and it is integrated with n drift layer 81.

By adjusting as appropriate a width R of an opening in ion implantation mask layer 40 shown in FIG. 8C here, silicon carbide semiconductor devices in first to third modifications which will be described later can be manufactured.

Figure 10A:
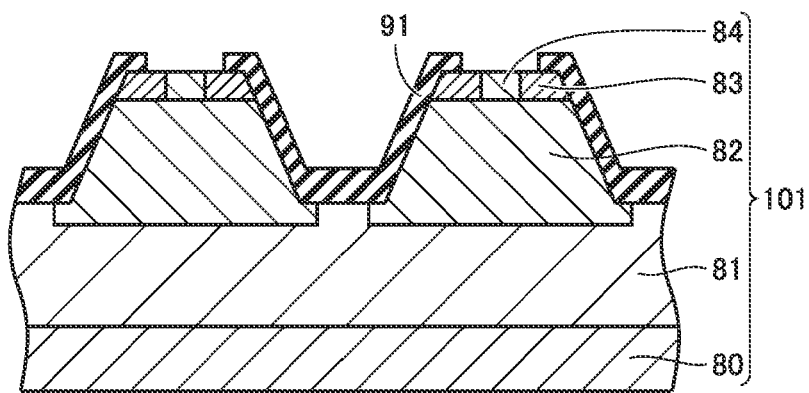
FIG. 10A is a partial cross-sectional view schematically showing the process for manufacturing the silicon carbide semiconductor device in one embodiment of the present invention.

Then, as shown in FIG. 10A, the step of forming gate insulating film 91 is performed. Here, gate insulating film 91 is formed to cover each of sidewall portion SW and bottom portion BT of trench TR. Gate insulating film 91 can be formed, for example, through thermal oxidation.

After gate insulating film 91 is formed, NO annealing using a nitrogen monoxide (NO) gas as an atmospheric gas may be performed. A temperature profile has a condition, for example, of a temperature not lower than 1100° C. and not higher than 1300° C. and a retention time period around 1 hour. Thus, nitrogen atoms are introduced in an interface region between gate insulating film 91 and p body layer 82. Consequently, formation of interface state at the interface region is suppressed, so that channel mobility can be improved. It is noted that, if such nitrogen atoms can be introduced, a gas other than the NO gas may be employed as an atmospheric gas.

After this NO annealing, Ar annealing using argon (Ar) as an atmospheric gas may further be performed. A heating temperature in Ar annealing is preferably higher than a heating temperature in NO annealing above and lower than a melting point of gate insulating film 91. A time period during which this heating temperature is retained is set, for example, to approximately 1 hour. Thus, formation of interface state at the interface region between gate insulating film 91 and p body layer 82 is further suppressed. It is noted that other inert gases such as a nitrogen gas may be employed as an atmospheric gas instead of the Ar gas.

Figure 10B:
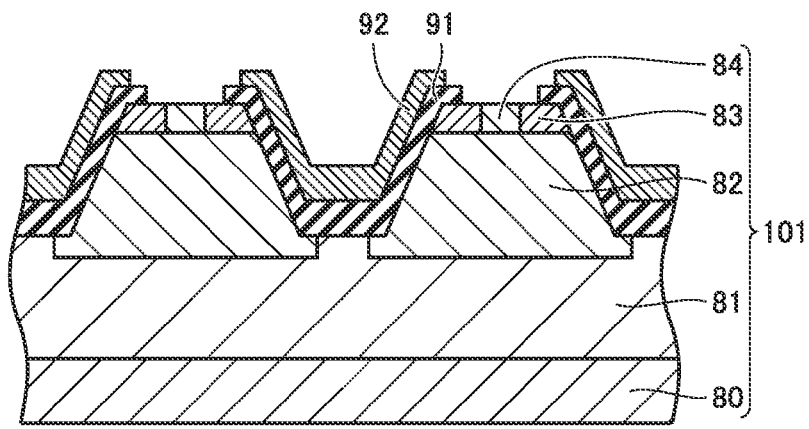
FIG. 10B is a partial cross-sectional view schematically showing the process for manufacturing the silicon carbide semiconductor device in one embodiment of the present invention.

Then, as shown in FIG. 10B, gate electrode 92 is formed on gate insulating film 91. A method of forming gate electrode 92 can be performed, for example, by forming a film of a conductor or doped polysilicon and performing CMP (Chemical Mechanical Polishing) or RIE.

Figure 10C:
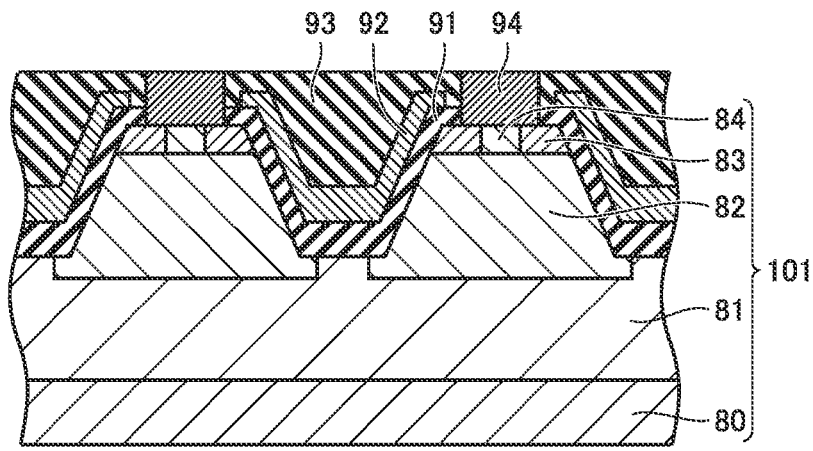
FIG. 10C is a partial cross-sectional view schematically showing the process for manufacturing the silicon carbide semiconductor device in one embodiment of the present invention.

Thereafter, as shown in FIG. 10C, interlayer insulating film 93 is formed on gate electrode 92 and gate insulating film 91 so as to cover an exposed surface of gate electrode 92. Etching is performed to form an opening in interlayer insulating film 93 and gate insulating film 91. This opening exposes each of n+ layer 83 and p contact region 84 at upper surface P2. Then, source electrode 94 in contact with each of n+ layer 83 and p contact region 84 is formed on upper surface P2. Furthermore, as shown in FIG. 1, drain electrode 98 is formed on lower surface P1 formed from n drift layer 81, with single crystal substrate 80 being interposed and source interconnection layer 95 is formed on interlayer insulating film 93 and source electrode 94. As above, silicon carbide semiconductor device 201 achieving both of a high breakdown voltage and a low ON resistance can readily be manufactured.

<<Second Manufacturing Method>>

Another method of manufacturing a silicon carbide semiconductor device in the present embodiment will now be described.

Initially, n drift layer 81 is formed on single crystal substrate 80 similarly to the first manufacturing method described previously.

Figure 9A:
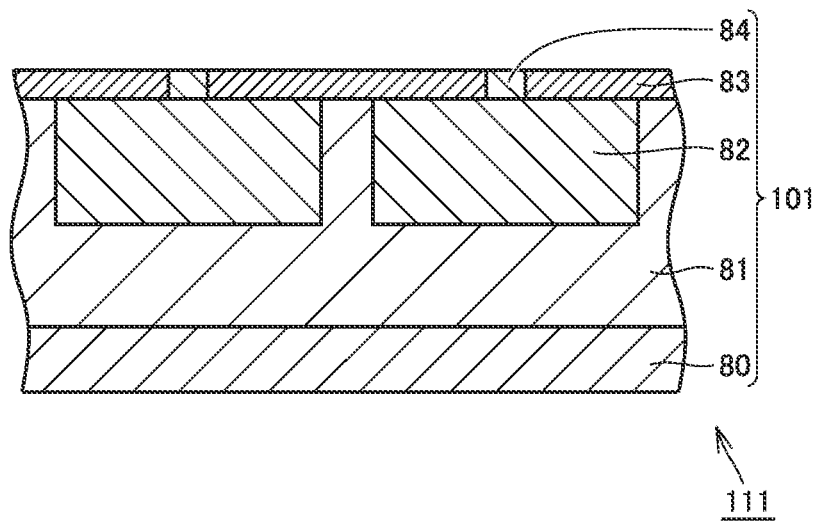
FIG. 9A is a partial cross-sectional view schematically showing a process for manufacturing the silicon carbide semiconductor device in one embodiment of the present invention.

Then, similarly to the first manufacturing method described previously, p body layer 82, n+ layer 83, and p contact region 84 are formed in n drift layer 81 and thus silicon carbide substrate 111 is prepared. In the second manufacturing method, however, as shown in FIG. 9A, two p body layers 82 are provided in n drift layer 81 at a distance from each other. Namely, silicon carbide substrate 111 including n drift layer 81, two p body layers 82 provided in n drift layer 81 at a distance from each other, and n+ layer 83 provided on n drift layer 81 and p body layers 82 is prepared. P body layer 82, n+ layer 83, and p contact region 84 can be formed through ion implantation or epitaxial growth as in the first manufacturing method.

Figure 9B:
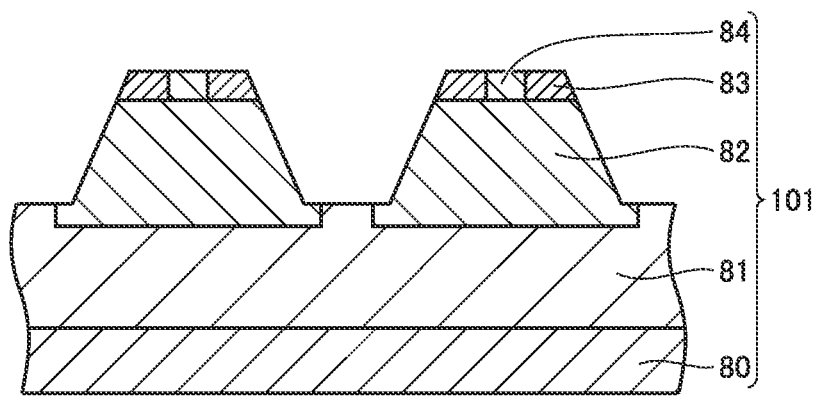
FIG. 9B is a partial cross-sectional view schematically showing the process for manufacturing the silicon carbide semiconductor device in one embodiment of the present invention.

Then, as shown in FIG. 9B, the step of forming trench TR is performed. In the second manufacturing method, trench TR is formed by providing an opening in n+ layer 83 from above a region between two p body layers 82. Namely, trench TR is formed to have sidewall portion SW reaching p body layer 82 through n+ layer 83 and bottom portion BT including the exposed surface of n drift layer 81. Since etching conditions in forming trench TR are the same as in the first manufacturing method, the same description will not be repeated.

Thereafter, as in the first manufacturing method, the steps of forming gate insulating film 91, gate electrode 92, interlayer insulating film 93, and source electrode 94 shown in FIGS. 10A to 10C are performed. Then, as shown in FIG. 1, drain electrode 98 is formed on lower surface P1 formed from n drift layer 81, with single crystal substrate 80 being interposed and source interconnection layer 95 is formed on interlayer insulating film 93 and source electrode 94. As above, silicon carbide semiconductor device 201 achieving both of a high breakdown voltage and a low ON resistance can readily be manufactured.

<Modification>

A modification of the silicon carbide semiconductor device according to the present embodiment will now be described with reference to FIGS. 4 to 6.

<<First Modification>>

Figure 4:
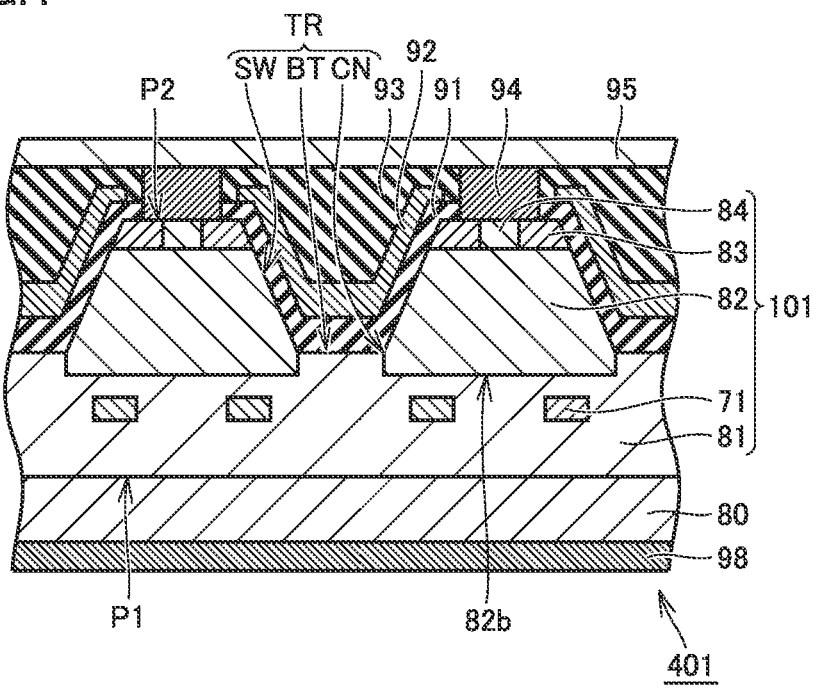
FIG. 4 is a diagram schematically showing a construction of a silicon carbide semiconductor device in one embodiment of the present invention.

A silicon carbide semiconductor device 401 according to a first modification shown in FIG. 4 is different from silicon carbide semiconductor device 201 shown in FIG. 1 in having embedded region 70 in n drift layer 81.

Embedded region 70 has the p-type (the second conductivity type), is spaced apart from p body layer 82 by n drift layer 81, and is provided at a distance from each of sidewall portion SW and bottom portion BT of trench TR. In this modification, since some of electric field applied across the source and the drain is allocated to embedded region 70, electric field applied to gate insulating film 91 is relaxed. Thus, reliability of the gate insulating film can further be enhanced. Such an embedded region 70 can be formed, for example, in n drift layer 81 through ion implantation.

As shown in FIG. 4, embedded region 70 is provided under p body layer 82 and preferably distant from p body layer 82 by not smaller than 0.5 μm and not greater than 5 μm. Embedded region 70 is provided only at a position deeper than the position of bottom portion BT of trench TR, and a distance between embedded region 70 and bottom portion BT of trench TR is preferably not smaller than 0.5 μm and not greater than 5 μm. Being arranged at such a portion, embedded region 70 exhibits a sufficient electric field relaxing effect.

A value obtained by integrating impurity concentrations per unit volume of embedded region 70 in a direction of thickness (the vertical direction in FIG. 4) corresponds to a dose amount in ion implantation for forming embedded region 70. This dose amount is preferably not less than $1 \times 10^{12}$ cm$^{-2}$ and not more than $1 \times 10^{15}$ cm$^{-2}$ and it is set, for example, to $1 \times 10^{13}$ cm$^{-2}$. An impurity in embedded region 70 is represented, for example, by aluminum.

<<Second Modification>>

A silicon carbide semiconductor device 501 according to a second modification will be described with reference to FIG. 5. In silicon carbide semiconductor device 501, trench TR has corner portion CN at the boundary between bottom portion BT which is the bottom surface and sidewall portion SW, and corner portion CN is located in p body layer 82.

Figure 5:
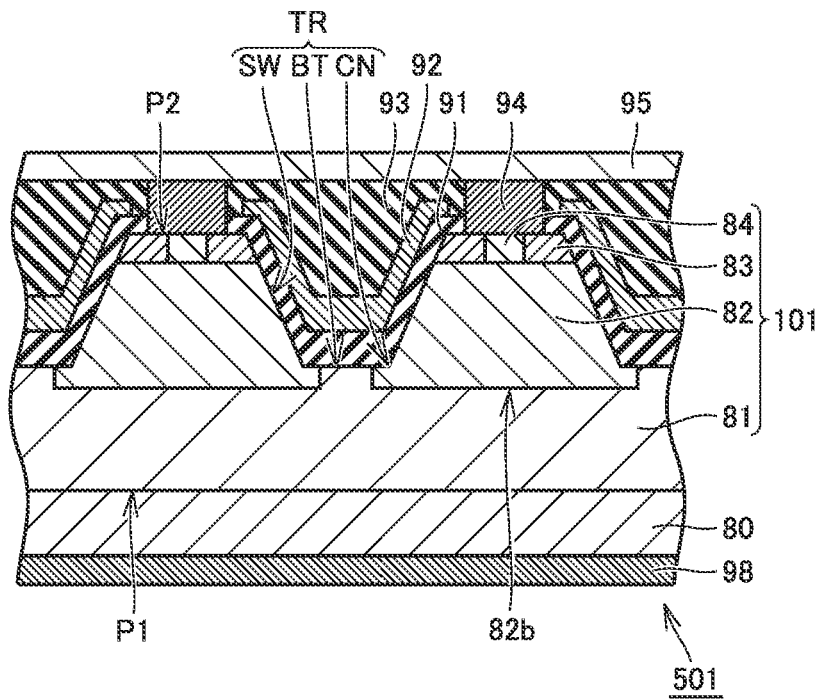
FIG. 5 is a diagram schematically showing a construction of a silicon carbide semiconductor device in one embodiment of the present invention.
Figure 6:
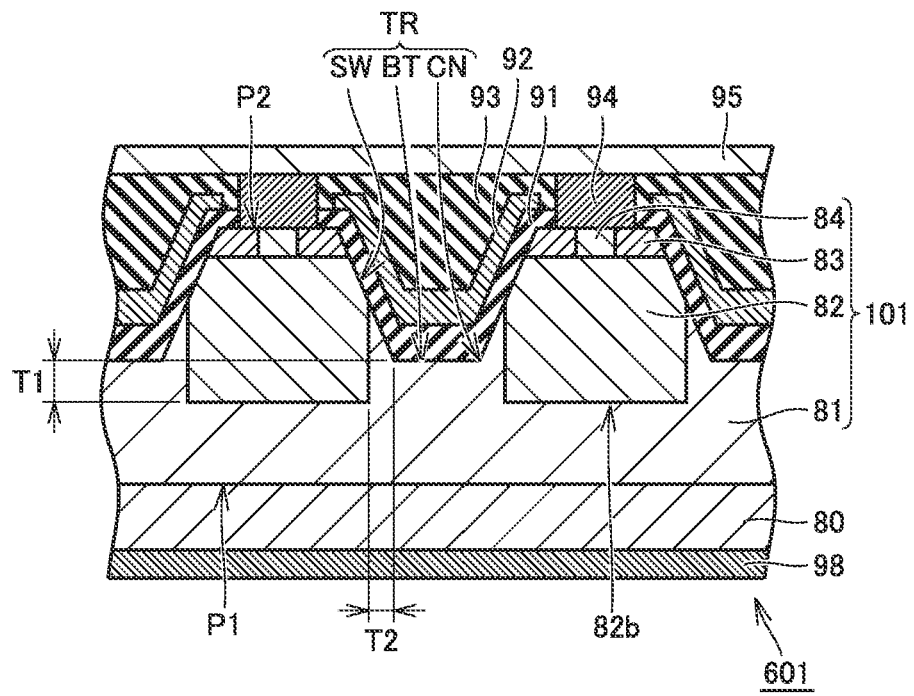
FIG. 6 is a diagram schematically showing a construction of a silicon carbide semiconductor device in one embodiment of the present invention.

In silicon carbide semiconductor device 501 shown in FIG. 5, a portion of the gate insulating film corresponding to corner portion CN is a portion where a film is small in thickness and among others breakdown is likely. In the present modification, by providing this corner portion CN in p body layer 82, electric field applied to corner portion CN is significantly relaxed and hence reliability of gate insulating film 91 is improved and the silicon carbide semiconductor device can achieve a higher breakdown voltage.

<<Third Modification>>

A silicon carbide semiconductor device 601 according to a third modification will be described with reference to FIG. 6. In silicon carbide semiconductor device 601, trench TR has corner portion CN at the boundary between bottom portion BT which is the bottom surface and sidewall portion SW, and corner portion CN is located in n drift layer 81. Then, a difference (T1 in FIG. 6) between a depth at which the bottom surface (bottom portion BT) of trench TR is located and a depth at which site 82*b* in p body layer 82 closest to lower surface P1 is located and a shortest distance (T2 in FIG. 6) between corner portion CN and p body layer 82 satisfy relation of T2<T1.

In this modification, as T2 is greater, an electric field relaxing effect at bottom portion BT of trench TR by the depletion layer is less. On the other hand, as T1 is greater, the electric field relaxing effect by the depletion layer is greater, and electric field applied to corner portion CN is weaker. Then, by satisfying relation of T2<T1, reliability of the gate insulating film can be sufficient based on balance between electric field applied to corner portion CN and the electric field relaxing effect.

Though the embodiment of the present invention has been described above, combination of structures in each embodiment described above as appropriate is also originally intended.

It should be understood that the embodiment disclosed herein is illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

40 mask layer; 70 embedded region; 80 single crystal substrate; 81 *n* drift layer (first layer); 81*a* implanted region; 82 *p* body layer (second layer); 82*b* site; 83 *n*+ layer (third layer); 84 *p* contact layer; 91 gate insulating film; 92 gate electrode; 93 interlayer insulating film; 94 source electrode; 95 source interconnection layer; 98 drain electrode; 101 silicon carbide layer; 110, 111 silicon carbide substrate; 201, 301, 401, 501, 601, 701 silicon carbide semiconductor device; TR trench; BT bottom portion; SW sidewall portion; CN corner portion; CD channel direction; P1 lower surface (first main surface); P2 upper surface (second main surface); S1 first surface; S2 second surface; and SQ, SR combined surface.

The invention claimed is:

1. A silicon carbide semiconductor device, comprising:
   a silicon carbide layer having a first main surface and a second main surface opposite to said first main surface, said silicon carbide layer including
      a first layer forming said first main surface and having a first conductivity type,
      a second layer provided in said first layer and having a second conductivity type different from said first conductivity type, and
      a third layer provided on said second layer as being spaced apart from said first layer, forming a part of said second main surface, and having said first conductivity type,
   said second main surface of said silicon carbide layer being provided with a trench having a depth in a direction from said second main surface toward said first main surface,
   said trench having a sidewall portion where said second layer and said third layer are exposed and a bottom portion continuing to said sidewall portion, where said first layer is exposed;
   a gate insulating film covering each of said sidewall portion and said bottom portion; and
   a gate electrode provided on said gate insulating film,
   in said direction of depth of said trench, a position of said bottom portion of said trench being located on a side of said second main surface relative to a site located closest to said first main surface in a region where said second layer and said first layer are in contact with each other, or located as deep as said site in said direction of depth wherein
   said bottom portion of said trench includes a bottom surface extending in a direction crossing said sidewall portion,
   said trench has a corner portion at a boundary portion between said bottom surface and said sidewall portion, and
   said corner portion is located in said second layer.

2. The silicon carbide semiconductor device according to claim 1, wherein
   on said sidewall portion, said second layer is provided with a surface including a first surface having a plane orientation {0-33-8}.

3. The silicon carbide semiconductor device according to claim 1, wherein
   a portion of said gate insulating film covering said bottom portion is greater in thickness than a portion of said gate insulating film covering said sidewall portion.

4. The silicon carbide semiconductor device according to claim 1, further comprising an embedded region having said second conductivity type in said first layer, wherein
   said embedded region is spaced apart from said second layer by said first layer and distant from each of said sidewall portion and said bottom portion of said trench.

5. The silicon carbide semiconductor device according to claim 1, wherein
   an n-type is defined as said first conductivity type and a p-type is defined as said second conductivity type.

* * * * *